(12) United States Patent
Falk

(10) Patent No.: US 9,484,734 B2
(45) Date of Patent: *Nov. 1, 2016

(54) PROTECTION OF PHOTOVOLTAIC MODULES OF A PHOTOVOLTAIC GENERATOR AGAINST SURGE VOLTAGES RELATIVE TO GROUND

(71) Applicant: SMA Solar Technology AG, Niestetal (DE)

(72) Inventor: Andreas Falk, Kassel (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 152 days.

This patent is subject to a terminal disclaimer.

(21) Appl. No.: 14/453,775

(22) Filed: Aug. 7, 2014

(65) Prior Publication Data

US 2014/0347770 A1  Nov. 27, 2014

Related U.S. Application Data

(63) Continuation of application No. PCT/EP2013/052732, filed on Feb. 12, 2013.

(30) Foreign Application Priority Data

Feb. 20, 2012  (DE) ......................... 10 2012 101 340

(51) Int. Cl.
*H02H 3/00* (2006.01)
*H02H 3/16* (2006.01)
(Continued)

(52) U.S. Cl.
CPC ............ *H02H 3/16* (2013.01); *G01R 31/025* (2013.01); *H01L 31/02021* (2013.01); *H02H 7/20* (2013.01); *H02M 2001/322* (2013.01); *Y02E 10/56* (2013.01)

(58) Field of Classification Search
CPC ...................................................... H02H 3/16

USPC ............................................................. 361/42
See application file for complete search history.

(56) References Cited

U.S. PATENT DOCUMENTS 4,810,936 A     3/1989  Nuckolls et al.
6,111,767 A *   8/2000  Handleman ............... G05F 1/67
                                                    136/293

(Continued)

FOREIGN PATENT DOCUMENTS

CN      2283948 Y      6/1998
CN    201230282 Y      4/2009

(Continued)

OTHER PUBLICATIONS

Non Final Office Action Dated Nov. 19, 2015 U.S. Appl. No. 13/860,805.

(Continued)

*Primary Examiner* — Stephen W Jackson
(74) *Attorney, Agent, or Firm* — Eschweiler & Associates, LLC

(57) ABSTRACT

For protecting a photovoltaic generator comprising photovoltaic modules, having an open circuit voltage higher than an insulation design voltage of its photovoltaic modules and being connected to an AC power grid via an inverter against a surge voltage relative to ground resulting from a ground fault and exceeding the insulation design voltage, the photovoltaic generator is surveyed for the occurrence of the ground fault or the surge voltage. Upon the actual occurrence of the ground fault or the surge voltage, at first, the photovoltaic generator is separated from an input-side intermediate link capacitance of the inverter, and the inverter is separated from the AC power grid. Then, the intermediate link capacitance is discharged via a resistor, prior to permanently closing semiconductor switches of an inverter bridge of the inverter and to reconnecting the photovoltaic generator to the input-side intermediate link capacitance of the inverter to short circuit the photovoltaic generator.

12 Claims, 2 Drawing Sheets

(51) Int. Cl.
*H01L 31/02* (2006.01)
*H02H 7/20* (2006.01)
*G01R 31/02* (2006.01)
*H02M 1/32* (2007.01)

(56) References Cited

U.S. PATENT DOCUMENTS

| | | | |
|---|---|---|---|
| 7,256,566 B2* | 8/2007 | Bhavaraju | G05F 1/67 320/101 |
| 8,194,375 B2* | 6/2012 | Said El-Barbari | H01L 31/02021 361/91.1 |
| 8,559,201 B2* | 10/2013 | Fujii | H02H 7/122 323/266 |
| 8,749,934 B2* | 6/2014 | Hackenberg | H02J 1/10 136/244 |
| 8,963,503 B2* | 2/2015 | Wiederhold | G01R 31/028 320/134 |
| 2006/0196535 A1 | 9/2006 | Swanson et al. | |
| 2009/0078304 A1 | 3/2009 | Gilmore et al. | |
| 2009/0201706 A1 | 8/2009 | Zacharias et al. | |
| 2009/0244938 A1 | 10/2009 | Gebert | |
| 2010/0135054 A1 | 6/2010 | Zacharias | |
| 2011/0203635 A1 | 8/2011 | Beck | |
| 2012/0139347 A1 | 6/2012 | Hackenberg | |
| 2013/0058140 A1 | 3/2013 | Victor et al. | |
| 2013/0221755 A1 | 8/2013 | Falk | |

FOREIGN PATENT DOCUMENTS

| | | |
|---|---|---|
| DE | 3041078 A | 6/1982 |
| DE | 202006008936 U1 | 8/2006 |
| DE | 102007050554 A1 | 4/2009 |
| DE | 102011015392 A1 | 10/2012 |
| EP | 2284973 A1 | 2/2011 |
| JP | 2010225776 A | 10/2010 |
| WO | 2011135239 A1 | 11/2011 |

OTHER PUBLICATIONS

International Search Report dated May 7, 2013 for international application No. PCT/EP2013/052732.
International Search Report and Written Opinion of the International Searching Authority dated Jan. 23, 2012 for International Application No. PCT/EP2011/069529. 1-12 Pages.
S. Pingel, et al.; "Potential Induced Degradation of Solar Cells and Panels"; 2010 IEEE, p. 1-6.
Final Office Action Dated Jul. 1, 2016 U.S. Appl. No. 13/860,805.

* cited by examiner

PROTECTION OF PHOTOVOLTAIC MODULES OF A PHOTOVOLTAIC GENERATOR AGAINST SURGE VOLTAGES RELATIVE TO GROUND

CROSS REFERENCE TO RELATED APPLICATIONS

This application is a continuation of International Application PCT/EP2013/052732 with an International Filing Date of Feb. 12, 2013 and claiming priority to co-pending German Patent Application No. 10 2012 101 340.3, entitled "Verfahren zum Schutz von Photovoltaikmodulen eines Photovoltaikgenerators vor Überspannungen gegenüber Erde", filed on Feb. 20, 2012.

FIELD

The present disclosure generally relates to a method of protecting a photovoltaic generator in case of a ground fault. More particular the present disclosure relates to a method of protecting a photovoltaic generator, which includes photovoltaic modules, which has an open-circuit voltage higher than an insulation design voltage of its photovoltaic modules, and which is connected to an AC power grid via an inverter, against a surge voltage relative to ground resulting from a ground fault and exceeding the insulation design voltage.

BACKGROUND

A photovoltaic generator typically comprises at least one string made of photovoltaic modules connected in series; as a rule it has a plurality of such strings connected in parallel.

If a photovoltaic generator insulated with regard to ground is operated without reference to ground, the system voltage, i.e. the voltage present between the connections of the photovoltaic generator to the inverter, is symmetrically distributed with regard to ground. Then, the voltage relative to ground which is present at one of the photovoltaic modules of the photovoltaic generator is half the system voltage at maximum.

Depending on the construction of the inverter, for example, in case of a galvanic separation in the area of the inverter or in case of using a galvanically separating transformer, it is possible to directly ground one point of the photovoltaic generator or to indirectly predetermine the voltage of this point with regard to ground, i.e. its potential, by suitable means. Thus, for example, the center point of a photovoltaic generator may be grounded to split its system voltage symmetrically with regard to ground. Alternatively, the positive or negative connection of a photovoltaic generator to the inverter may be grounded to keep all of its photovoltaic modules at a negative or positive potential which is an advantage for the lifetime of certain photovoltaic modules, or to asymmetrically predetermine the potential of the center point or of the positive or negative connection with regard to ground, see DE 20 2006 008 936 U1. In case of a ground fault in the area of the photovoltaic generator or its connections to the inverter, this ground reference has to be immediately interrupted to avoid high ground currents.

In case of a ground fault at a photovoltaic generator operated insulated from ground or purposefully separated from ground due to a ground fault, there is the danger that parts of the photovoltaic generator are raised up to the full system voltage relative to ground. This is critical if the system voltage exceeds the insulation design voltage of the photovoltaic modules of the photovoltaic generator. The insulation design voltage is that value of the voltage which may, at maximum, be present between a photovoltaic module of the photovoltaic generator and ground, as the photovoltaic modules do not have a sufficient insulation protection for any higher voltages and/or as it is generally not allowed to exceed this insulation design voltage at the photovoltaic generator according to relevant security regulations.

As the system voltage in operation of a photovoltaic generator does not exceed the open-circuit voltage of the photovoltaic generator, the danger of surge voltages exceeding the insulation design voltage of the photovoltaic modules of the photovoltaic generator only exists if the photovoltaic generator has a higher open-circuit voltage than the insulation design voltage of its photovoltaic modules. Vice versa, this danger is in fact present in each photovoltaic generator whose open-circuit voltage exceeds the insulation design voltage of its photovoltaic modules, because the photovoltaic generator may be in open-circuit operation when a ground fault occurs.

Comparatively high system voltages at the DC voltage side of an inverter are an advantage in feeding electric energy from a photovoltaic generator into an AC power grid as they limit the currents necessarily flowing for transferring a certain electric power from the photovoltaic generator to the inverter and to thus limit the line cross-sections required for conducting these currents.

In case of a known method of protecting a photovoltaic generator in case of a ground fault, the photovoltaic generator, in case of the ground fault, is short circuited between its connections to the inverter via a contactor. A security device suitable for this method is known from WO 2011/135239 A1. The contactor has to be of a sufficiently big dimension to cope with high currents, particularly if the photovoltaic generator comprises a plurality of strings connected in parallel and made of photovoltaic modules connected in series. In this case, the short-circuit current may be much higher than the nominal current from the photovoltaic generator. As a result, the contactor for short circuiting the photovoltaic generator becomes quite expensive.

For the purpose of limiting a photovoltaic voltage to a value allowable for a connected load, it is known from DE 30 41 078 A1 to periodically temporarily short circuit a part of the photovoltaic generator providing the photovoltaic voltage, i.e., a some of its photovoltaic modules, by means of a switch. Here, the photovoltaic voltage not bypassed by the switch is always smaller than or equal to the maximum allowable or nominal voltage of the connected devices. The switch for short circuiting a part of the photovoltaic generator is arranged at the location of the photovoltaic generator. If the photovoltaic generator comprises a plurality of strings of photovoltaic modules connected in parallel, one switch for partially short circuiting has to be provided for each string.

As a further development of the teaching of DE 30 41 078 A1, it is known from DE 10 2010 009 120 B4 to protect a large-sized photovoltaic power plant against surge voltages in case of no AC current being fed in that a short-circuit switch by which a part of the photovoltaic modules of the respective string is short circuited is only provided with some of its strings connected in parallel. In this way, it is intended to also reduce the potential of the strings without short-circuit switches to the lower potential and thus to a non-dangerous value. Here, a reduced number of switches but still some switches are used outside the inverter via which electric power is fed into the AC power grid. Further, it is hardly sufficient to only short circuit parts of few strings of a photovoltaic generator as there is otherwise the danger that the system voltage is not reduced in this way but a backflow current through the partially short circuited strings is caused instead, if this is not avoided by means of additional measures further increasing the constructional efforts for this solution.

From EP 2 284 973 A1 it is generally known that a photovoltaic generator may be short circuited via the semiconductor switches of an inverter bridge of an inverter to which the photovoltaic generator is connected for feeding electric energy into an AC power grid, after an input side intermediate link capacitance of the inverter has been discharged via a resistor. Here, the photovoltaic generator is short circuited to remove the driving force of a backflow current which has been registered with one of the strings of the photovoltaic generator connected in parallel. This registration takes place via current sensors which are assigned to each one of the individual strings and whose signals are supplied to the inverter from the outside. The photovoltaic generator is not surveyed for a ground fault, and any ground fault is also not indirectly registered in the form of backflow currents, as at least simple ground faults do not cause such backflow currents. EP 2 284 973 A1 does also not deal with keeping an insulation design voltage of photovoltaic modules of the photovoltaic generator.

There still is a need of a method for protecting photovoltaic modules of a photovoltaic generator against surge voltages relative to ground in case of a ground fault, which may be implemented in an inverter for feeding electric energy from the photovoltaic generator into an AC power grid without high constructional effort and costly components.

SUMMARY

The present disclosure relates to a method of protecting a photovoltaic generator comprising photovoltaic modules against a surge voltage relative to ground, the photovoltaic generator having an open circuit voltage higher than an insulation design voltage of its photovoltaic modules and being connected to an AC power grid via an inverter having an input-side intermediate link capacitance and an inverter bridge including semiconductor switches, the surge voltage resulting from a ground fault and exceeding the insulation design voltage. The method comprises surveying the photovoltaic generator for the occurrence of the ground fault or the resulting surge voltage. Upon occurrence of the ground fault or the resulting surge voltage, at first, separating the photovoltaic generator from the input-side intermediate link capacitance of the inverter and separating the inverter from the AC power grid, and, then, discharging the input-side intermediate link capacitance of the inverter via a resistor, prior to permanently closing semiconductor switches of the inverter bridge of the inverter and to reconnecting the photovoltaic generator to the input-side intermediate link capacitance of the inverter to short circuit the photovoltaic generator.

Other features and advantages of the present disclosure will become apparent to one with skill in the art upon examination of the following drawings and the detailed description. It is intended that all such additional features and advantages be included herein within the scope of the present disclosure, as defined by the claims.

BRIEF DESCRIPTION OF THE DRAWINGS

The disclosure can be better understood with reference to the following drawings. The components in the drawings are not necessarily to scale, emphasis instead being placed upon clearly illustrating the principles of the present disclosure. In the drawings, like reference numerals designate corresponding parts throughout the several views.

DETAILED DESCRIPTION

Figure 1:
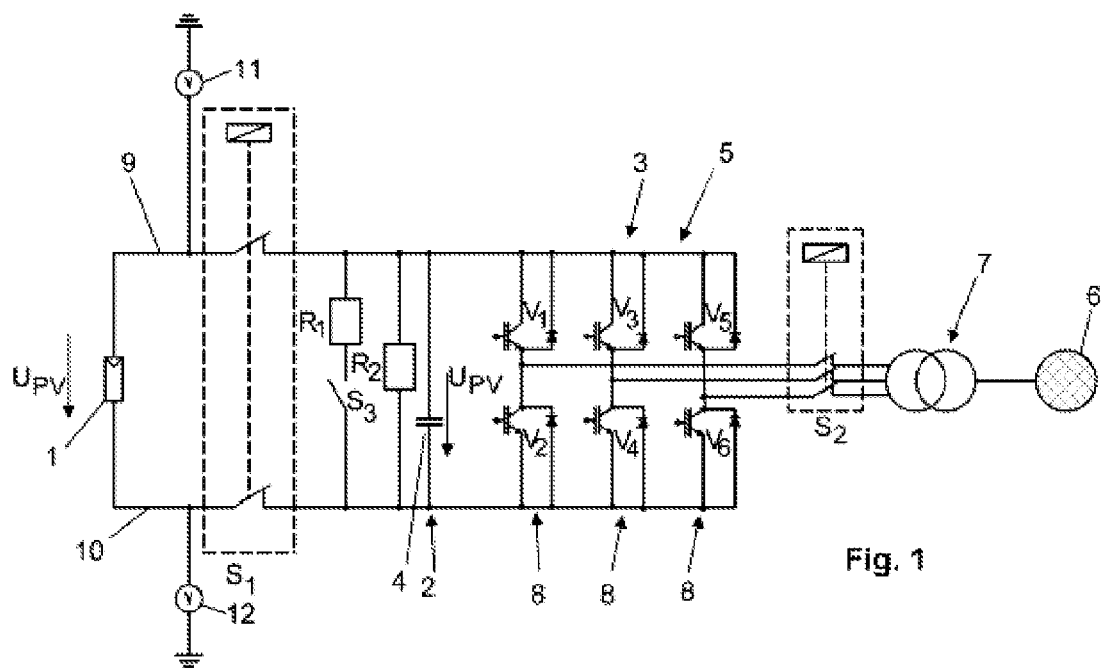
FIG. 1 shows a photovoltaic generator connected to an AC power grid via an inverter in normal operation.

The method of this disclosure comprises surveying the photovoltaic generator for the occurrence of a ground fault or of a surge voltage relative to ground exceeding an insulation design voltage and resulting from a ground fault. In case of the occurrence of the ground fault or the resulting surge voltage, the method comprises at first, separating the photovoltaic generator from an input side intermediate voltage link capacitance of the inverter and the inverter from the AC power grid, and then, de-charging the input side intermediate link capacitance of the inverter via a resistor, prior to permanently closing semiconductor switches of an inverter bridge of the inverter and reconnecting the photovoltaic generator with the input side intermediate voltage link capacitance of the inverter again to short circuit the photovoltaic generator.

The intermediate voltage link capacitance of the inverter may be provided by one or more capacitors. If more than one capacitor is providing the intermediate voltage link capacitance of the inverter, these capacitors may be connected in series or in parallel.

For carrying out the method according to the present disclosure, it is sufficient to connect a series connection of a resistor and a switch in parallel to the input side intermediate link capacitance of the inverter to discharge the intermediate link capacitance via the resistor by closing the switch. Such a switchable discharge resistor may even be provided anyway. As a rule, contactors for separating the photovoltaic generator from the input side intermediate link capacitance of the inverter and of the inverter from the AC power grid are provided anyway.

The switch which, connected in series with the resistor, is connected in parallel to the input side intermediate link capacitance of the inverter does not need to fulfill particular requirements, as the resistor limits the current flowing through the switch to an easily manageable value, even in case of a maximally charged intermediate link capacitance. The switch may thus be a semiconductor switch. It may, however, also be made as a relay or a contactor.

In that the semiconductor switches of the inverter bridge of the inverter, when short circuiting the photovoltaic generator, are protected against high short-circuit currents by the previously discharged intermediate link capacitance, they are able to provide the short-circuit of the photovoltaic generator desired for reducing the system voltage, i.e. to carry the short-circuit currents flowing then. They have to have a sufficient proof voltage for switching the open circuit voltage of the photovoltaic generator anyway.

In the method of the disclosure it is accepted that, in the period of time between separating the photovoltaic generator from the input side intermediate link capacitance of the inverter up to reconnecting the photovoltaic generator to the inverter, the maximum voltage of the photovoltaic generator relative to ground is not only not reduced but may even increase up to its open circuit voltage. Such short-time surge voltages with a duration of about one or even several seconds, however, are not critical for the integrity of the photovoltaic modules of the photovoltaic generator. In this regard, it has to be considered that, in the method of the disclosure, the surge voltages relative to ground due to a ground fault are generally limited to about 50% of the insulation design voltage. Such limited surge voltages are even not critical if they last, for example, for 1 minute.

In one embodiment, not only some but all semiconductor switches of the inverter bridge of the inverter are permanently closed for short circuiting the photovoltaic generator such that the resulting currents are distributed over all half bridges connected in parallel and their switches.

In one embodiment, all semiconductor switches of the inverter bridge of the inverter are temporarily opened, actually as soon as or before the inverter is separated from the AC power grid, and until they are permanently closed after discharging the input side intermediate link capacitance of the inverter. Generally, the semiconductor switches of the inverter bridge of the inverter may still be pulsed until they are permanently closed.

In the method according to one embodiment of the disclosure, the photovoltaic generator is separated from the input side intermediate link capacitance of the inverter at the same time at which the inverter is separated from the AC power grid. Generally, however, one of the separations may take place prior to the other one. It is, for example, considerable that the photovoltaic generator is immediately separated from the inverter, whereas the inverter remains connected to the AC power grid and whereas the semiconductor switches of its inverter bridge are pulsed as long as the intermediate link voltage across its input side intermediate link capacitance still allows for feeding electric power into the AC power grid.

Further, in one embodiment it is desirable with regard to the timing of the method according to the disclosure that the semiconductor switches of the inverter bridge of the inverter are permanently closed before the photovoltaic generator is reconnected to the input side intermediate link capacitance of the inverter. Due to the buffer effect of the intermediate link capacitance, however, simultaneous actions or a quick reversed sequence of the actions are also possible.

The lost power or heat generated in the closed semiconductor switches of the inverter bridge of the inverter due to the short-circuit current remains small. Nevertheless, it is an advantage to ensure a cooling of the semiconductor switches even then when an energy supply via the AC power grid is not ensured. For this purpose, a special energy storage may be assigned to the inverter. In case of normally off semiconductor switches of the inverter bridge, it has also to be ensured for the case of a fault of the AC power grid that the semiconductor switches may be permanently operated into their on-state for permanently short circuiting the photovoltaic generator to avoid surge voltages.

In the method according to the disclosure, any offset control for the potential of one of the connections of the photovoltaic generator to the inverter which may be provided is switched off in case of the occurrence of a ground fault or of a resulting surge voltage, in so far as this offset control is not anyway terminated due to the change of operation of the inverter in the course of the method according to the disclosure.

In case of a ground fault resulting in a surge voltage not exceeding the insulation design voltage, the photovoltaic generator does not need to be short circuited. Instead, electric energy from the photovoltaic generator may still be fed into the AC power grid by means of the inverter. Only the occurrence of a surge voltage exceeding the insulation design voltage which does not vanish by itself during a predefined maximum period of time is a strong criterion for short circuiting the photovoltaic generator according to the method according to the disclosure.

With regard to all measures which are taken for short circuiting the photovoltaic generator, the method according to the disclosure may be carried out within the inverter or at least at the location of the inverter. The same applies to the survey of the photovoltaic generator for the occurrence of a ground fault, or, particularly, for the occurrence of a resulting surge voltage exceeding the insulation design voltage. Particularly, the photovoltaic generator may be surveyed by measuring the voltages of its connections to the inverter relative to ground.

Referring now in greater detail to the drawings, FIG. 1 illustrates a photovoltaic generator 1 which, as a rule, does not only comprise a series connection of individual photovoltaic modules for providing a so-called string, but also a parallel connection of such strings of photovoltaic modules. The photovoltaic generator 1 is connected to an input side intermediate link 2 of an inverter 3 via a first connector S1. The intermediate link 2 comprises an intermediate link capacitance 4. An inverter bridge 5 of the inverter 3 feeds electric energy out of the intermediate link 2 charged by the photovoltaic generator 1 into an AC power grid 6. The inverter 3 is connected to the AC power grid 6 via a connector S2 and a galvanically separating transformer 7. For feeding a three-phase AC current into the AC power grid 6, the inverter bridge 5 here comprises three half bridges 8 in each of which two semiconductor switches V1 and V2, V3 and V4, and V5 and V6, respectively, are connected in series. Between the connector S1 and the inverter bridge 5, a series connection of a resistor R1 and of a switch S3 is connected in parallel to the intermediate link capacitance 4 to be able to quickly discharge the intermediate link voltage $U_{ZWK}$ via the resistor R1 by closing the switch S3, particularly quicker than via a high ohmic discharge resistor R2 which is permanently connected in parallel to the intermediate link capacitance 4 for security reasons. Particularly, the resistor R1 is dimensioned in such a way that even an intermediate link voltage $U_{ZWK}$ dropping over the intermediate link capacitance 4, which has the height of the open circuit voltage $U_0$ of the photovoltaic generator, drops down to a threshold voltage $U_{max}$ within a period of time t, wherein $$U_{max} = U_0 \cdot e^{-t/R1 \cdot C}$$

applies, wherein C is the value of the intermediate link capacitance 4. With a threshold voltage of, for example, 30 V, at which the intermediate link capacitance 4 may be regarded as discharged, and with a typical intermediate link capacitance of 10 to 20 mF, as well as with a tolerable maximum discharge period of time of the intermediate link capacitance 4 of, for example, one second, this results at $U_0$ of, for example, 1,500 V into a resistor R1 of 12.5 to 25Ω. This resistor limits the short-circuit current at the initial voltage of 1,500 V to 60 to 120 A for which the switch S3 has to be designed. This design can be achieved by a low-cost semiconductor switch, relay or contactor.

The switch S3 is used for discharging the intermediate link capacitance 4 when, during measurements of voltages at connections 9 and 10 of the photovoltaic generator 1 to the inverter 3 which may, for example, be made with voltmeters 11 and 12, it is acknowledged that a surge voltage relative to ground is present which exceeds an insulation design voltage of the photovoltaic generator 1 or its photovoltaic modules. In normal operation of the photovoltaic generator 1, its output voltage $U_{PV}$ is symmetrically divided up relative to ground as a system voltage of the inverter 3 so that the two voltmeters 11 and 12 measure same voltages U1 and U2 each of half the $U_{PV}$ with regard to their absolute values. The intermediate link voltage $U_{ZWK}$ is equal to $U_{PV}$ here. If, however, there is a ground fault, which, for example, connects the connection 9 to ground, the voltage relative to ground registered by the voltmeter 11 breaks down to zero, whereas the voltage relative to ground registered by the voltmeter 12 increases up to $U_{PV}$. If $U_{PV}$ then exceeds the insulation design voltage, which may be dependent on the present insolation conditions, this state has to be eliminated quickly. For this purpose, at first the contactors S1 and S2 are opened to separate the inverter 3 both from the photovoltaic generator 1 and from the AC power grid 6. Then, by means of closing the switch S3, the intermediate link capacitance 4 is quickly discharged via the resistor R1. Upon reaching the threshold voltage acceptable for the semiconductor switches V1 to V6, all semiconductor switches V1 to V6 of the inverter bridge 5, which have been temporarily opened when opening the contactors S1 and S2, are permanently closed, and by means of reclosing the contactor S1, the photovoltaic generator 1 is then short-circuited via the inverter bridge 5. The switch S3 may be kept closed further. The switch S3 alone, however, is not suited for short-circuiting the photovoltaic generator 1 for limiting the voltage relative to ground present at the photovoltaic generator 1, as the switch S3 together with the resistor R1 is not designed for the currents which would have to be conducted for this purpose. These currents, however, are conducted by the semiconductor switches V1 to V6 of the inverter bridge 5 without problem, the currents distributing over the three half bridges 8 of the inverter bridge 5.

Figure 2:
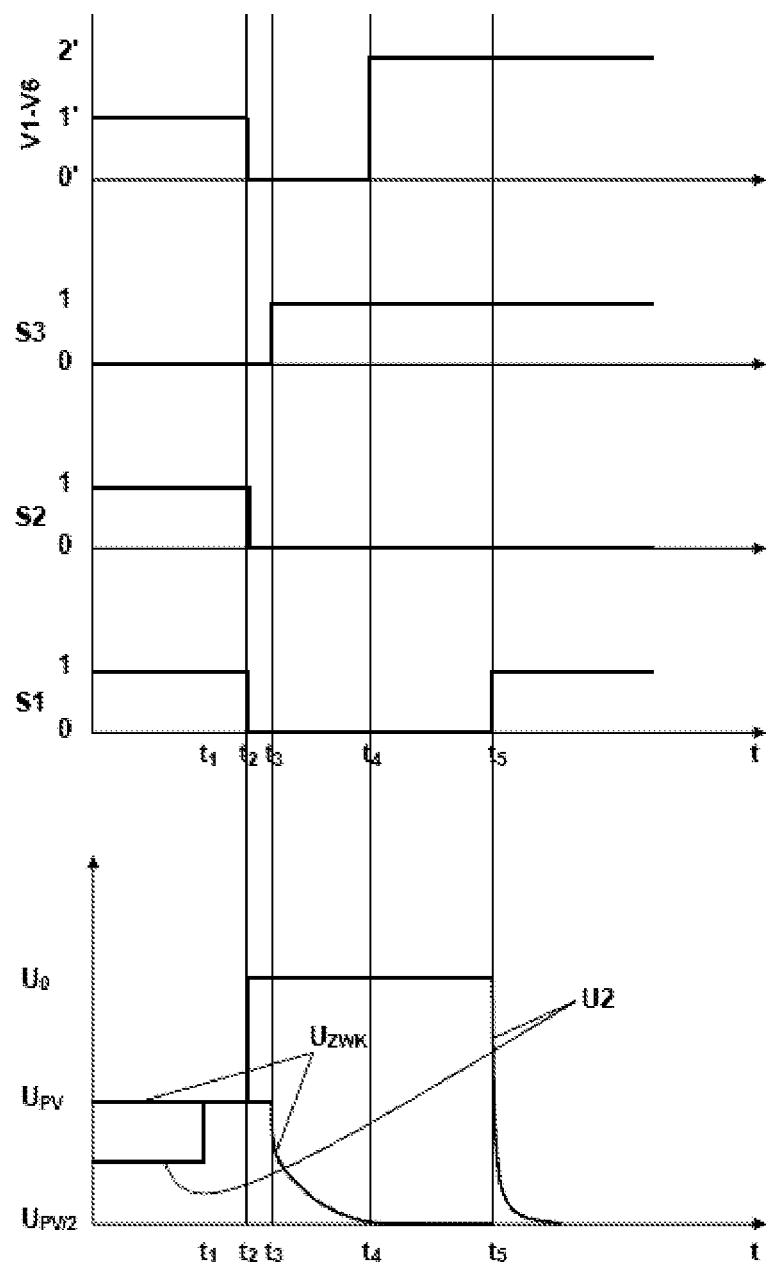
FIG. 2 shows the temporal sequence of the method according to the disclosure and the resulting voltages relative to ground at the inverter according to FIG. 1.

FIG. 2 shows the signals by which the switches S1 to S3 and V1 to V6 are operated as a result of the registration of a surge voltage to short circuit the photovoltaic generator 1, and the resulting voltages. At first, for a period of time up to t1, the normal operation is depicted. In this normal operation, the semiconductor switches V1 to V6 are pulsed, which is indicated by a control signal of 1'. The contactors S1 and S2 are closed. The corresponding control signals are at 1. The switch S3 is open. The corresponding control signal is at 0. The intermediate link voltage $U_{ZWK}$ comprises the same value as the photovoltaic voltage $U_{PV}$. The values of the two voltages U1 and U2 relative to ground measured by the voltmeters 11 and 12 are $U_{PV}/2$ each. Here, the course of the value of the voltage U2 measured by the voltmeter 12 is depicted. At the point in time t1, a ground fault occurs, which directly connects the connection 9 to ground. Correspondingly, the potential of the connection 10, i.e. U2, increases to $U_{PV}$, which is registered at the voltmeter 12. If, as assumed in the example depicted in the figure, the value of the voltage $U_{PV}$ exceeds the allowable insulation design voltage of the photovoltaic modules, the contactors S1 and S2 and all semiconductor switches V1 to V6 are opened at a point in time t2 as a reaction. In the following, the voltage U2 increases up to the open circuit voltage $U_0$ of the photovoltaic generator. At a point in time t3, the switch S3 is then closed to discharge the intermediate link capacitance 4. Correspondingly, the intermediate link voltage $U_{ZWK}$ decreases exponentially. At a point in time t4, the intermediate link voltage has dropped to a threshold voltage at which the semiconductor switches V1 to V6 may be permanently closed without any danger, which is depicted by a control signal of a value 2'. If at a following point in time t5 the contactor S1 is closed again and newly connects the photovoltaic generator to the inverter, the photovoltaic generator is short circuited by means of the closed semiconductor switches V1 to V6 of the inverter bridge 5 so that the voltage U2 quickly drops to zero. The period of time between t1 and the drop of U2 below the starting value of $U_{PV}/2$ and thus below the insulation design voltage of the photovoltaic modules of the photovoltaic generator is a few seconds and may be limited to three, two or even one second(s). The distances between the points in time t1 to t5 depicted in FIG. 2 are not necessarily to scale; thus, for example, the period from t4 to t5 may be considerably shorter than depicted; further, not all switching events which are depicted as coinciding at one point in time have necessarily to take place simultaneously. The different variation options with regard to the sequence of the switching events have already been indicated.

Many variations and modifications may be made to the preferred embodiments of the disclosure without departing substantially from the spirit and principles of the disclosure. All such modifications and variations are intended to be included herein within the scope of the present disclosure, as defined by the following claims.

The invention claimed is:

1. A method of protecting a photovoltaic generator comprising photovoltaic modules against a surge voltage relative to ground, the photovoltaic generator having an open circuit voltage higher than an insulation design voltage of its photovoltaic modules and being connected to an AC power grid via an inverter having an input-side intermediate link capacitance and an inverter bridge including semiconductor switches, the surge voltage resulting from a ground fault and exceeding the insulation design voltage, the method comprising:
   surveying the photovoltaic generator for the occurrence of the ground fault or the resulting surge voltage, and
   upon occurrence of the ground fault or the resulting surge voltage,
   at first, separating the photovoltaic generator from the input-side intermediate link capacitance of the inverter and separating the inverter from the AC power grid, and then, discharging the input-side intermediate link capacitance of the inverter via a resistor,
   prior to permanently closing the semiconductor switches of the inverter bridge of the inverter and prior to reconnecting the photovoltaic generator to the input-side intermediate link capacitance of the inverter to short circuit the photovoltaic generator.

2. The method of claim 1, wherein the photovoltaic generator is separated from the input-side intermediate link capacitance by opening an all-pole separating first contactor, wherein the inverter is separated from the AC power grid by opening an all-pole separating second contactor, and wherein the input-side intermediate link capacitance of the inverter is discharged by closing a switch connected in series with the resistor.

3. The method of claim 2, wherein the switch is one of a relay, a contactor or a further semiconductor switch.

4. The method of claim 1, wherein all semiconductor switches of the inverter bridge of the inverter are permanently closed to short-circuit the photovoltaic generator.

5. The method of claim 4, wherein all semiconductor switches of the inverter bridge of the inverter are temporarily opened prior to separating the inverter from the AC power grid and until they are permanently closed after discharging the intermediate link capacitance of the inverter.

6. The method of claim 1, wherein the photovoltaic generator is separated from the input-side intermediate link capacitance of the inverter at essentially a same point in time as the inverter is separated from the AC power grid.

7. The method of claim 1, wherein the semiconductor switches of the inverter bridge of the inverter are permanently closed prior to reconnecting the photovoltaic generator to the input-side intermediate link capacitance of the inverter.

8. The method of claim 1, wherein the permanently closed semiconductor switches of the inverter bridge of the inverter, upon a breakdown of the AC power grid, are further operated using electric energy out of an energy storage assigned to the inverter.

9. The method of claim 1, wherein the permanently closed semiconductor switches of the inverter bridge of the inverter, upon a breakdown of the AC power grid, are further cooled using electric energy out of an energy storage assigned to the inverter.

10. The method of claim 1, wherein an offset control for the potential of one of the connections of the photovoltaic generator at the input of the inverter is switched off upon the occurrence of the ground fault or the resulting surge voltage.

11. The method of claim 1, wherein upon the occurrence of a ground fault, which does not result in a surge voltage exceeding the insulation design voltage, electric energy from the photovoltaic generator is further fed into the AC power grid via the inverter.

12. The method of claim 1, wherein the photovoltaic generator is surveyed for the occurrence of the ground fault or the resulting surge voltage by measuring voltages relative to ground of connections of the photovoltaic generator to the inverter.

* * * * *